(12) United States Patent
Shiobara et al.

(10) Patent No.: US 8,933,158 B2
(45) Date of Patent: Jan. 13, 2015

(54) THERMOSETTING SILICONE RESIN COMPOSITION FOR REFLECTOR OF LED, REFLECTOR FOR LED USING THE SAME AND OPTICAL SEMICONDUCTOR APPARATUS

(71) Applicant: Shin-Etsu Chemical Co., Ltd., Tokyo (JP)

(72) Inventors: Toshio Shiobara, Annaka (JP);
Tsutomu Kashiwagi, Annaka (JP);
Yoshihira Hamamoto, Takasaki (JP);
Yoshihiro Tsutsumi, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/853,309

(22) Filed: Mar. 29, 2013

(65) Prior Publication Data

US 2013/0274398 A1 Oct. 17, 2013

(30) Foreign Application Priority Data

Apr. 16, 2012 (JP) .................................. 2012-093243

(51) Int. Cl.
*H01L 33/60* (2010.01)
*C08L 83/04* (2006.01)

(52) U.S. Cl.
CPC ................ *H01L 33/60* (2013.01); *C08L 83/04* (2013.01); *H01L 2224/32245* (2013.01);
(Continued)

(58) Field of Classification Search
None
See application file for complete search history.

(56) References Cited

U.S. PATENT DOCUMENTS 8,013,057 B2 * 9/2011 Taguchi et al. ............... 524/588
2007/0042533 A1 * 2/2007 Endo et al. .................... 438/118
(Continued)

FOREIGN PATENT DOCUMENTS

JP A-2006-140207 6/2006
JP A-2006-156704 6/2006
(Continued)

OTHER PUBLICATIONS

Apr. 8, 2014 Office Action issued in U.S. Appl. No. 13/853,368.

*Primary Examiner* — Robert S Loewe
(74) *Attorney, Agent, or Firm* — Oliff PLC

(57) ABSTRACT

A thermosetting silicone resin composition for reflector of LED has an organopolysiloxane represented by the following average compositional formula, and has at least two alkenyl groups in one molecule, a linear organohydrogen polysiloxane represented by the following formula and/or a branched organohydrogenpolysiloxane represented by the following formula, an addition reaction catalyst, a white pigment selected from titanium oxide, zinc oxide, magnesium oxide, barium carbonate, magnesium silicate, zinc sulfate and barium sulfate, and an inorganic filler other than Component, $$R^1_a R^2_b R^3_c (OR^0)_d SiO_{(4-a-b-c-d)/2} \quad (1)$$

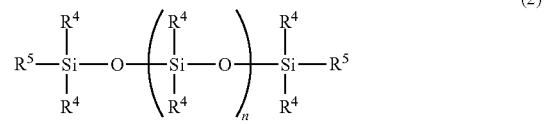

$$R^7_e R^8_f H_g SiO_{(4-e-f-g)/2} \quad (3).$$

There can be a thermosetting silicone resin composition which provides a cured product excellent in heat resistance and light resistance, less leakage of light to outside, and particularly suitable for a matrix array reflector.

11 Claims, 2 Drawing Sheets

(52) U.S. Cl.
CPC .............. *H01L 2224/48091* (2013.01); *H01L 2224/48247* (2013.01); *H01L 2224/73265* (2013.01); *H01L 2224/45144* (2013.01)
USPC ........... 524/413; 524/423; 524/424; 524/432; 524/433; 524/456

(56) References Cited

U.S. PATENT DOCUMENTS

2009/0171013 A1 7/2009 Taguchi et al.
2009/0258216 A1* 10/2009 Yamakawa et al. ........... 428/323
2009/0306263 A1 12/2009 Taguchi et al.
2011/0046319 A1* 2/2011 Ueno et al. ..................... 525/477
2011/0054072 A1 3/2011 Sawada et al.

FOREIGN PATENT DOCUMENTS

| JP | A-2007-235085 | 9/2007 |
| JP | A-2007-297601 | 11/2007 |
| JP | A-2007-329219 | 12/2007 |
| JP | A-2007-329249 | 12/2007 |
| JP | A-2008-189827 | 8/2008 |
| JP | A-2009-21394 | 1/2009 |
| JP | A-2009-155415 | 7/2009 |

* cited by examiner (A) (B)

THERMOSETTING SILICONE RESIN COMPOSITION FOR REFLECTOR OF LED, REFLECTOR FOR LED USING THE SAME AND OPTICAL SEMICONDUCTOR APPARATUS

BACKGROUND OF THE INVENTION

1. Field of the Invention

The present invention relates to a thermosetting silicone resin composition for forming a reflector for an LED, a reflector for an LED using the same and an optical semiconductor apparatus.

2. Description of the Related Art

An optical semiconductor device such as an LED (Light Emitting Diode) has now been utilized as various indicators or light sources for a street display, automobile lamp, and lighting for home. A thermoplastic resin such as a polyphthalamide resin (PPA) has been used as a material for a reflector for an LED with a large amount. In recent years, a thermosetting resin such as an epoxy resin using an acid anhydride as a curing agent has also been used as a material for a reflector.

It has already been disclosed in Patent Documents 1 to 5, and 7 to 9 that a thermosetting resin such as a silicone resin and an epoxy resin can be used as a material for a reflector of an LED. A matrix array type reflector has also been disclosed in Patent Document 6.

However, LED devices progress toward a high luminance is rapidly progressing as a back light of a recent liquid display television or a light source for general illumination, and a demand of reliability and durability for the LED is becoming more severe. In a thermoplastic resin such as a liquid crystalline polymer and PPA (polyphthalamide) or a thermosetting resin such as an epoxy resin which have conventionally been used as a reflector, there causes the problems that deterioration of the resin is remarkable in an environment that heat and light are simultaneously received, so that the resin is color-changed and light reflectance is lowered whereby it cannot be used.

In Patent Documents 1 to 3, there are disclosed an epoxy resin and a silicone resin, but there is no detailed description about the resins themselves. In general, a silicone resin includes various ones from a liquid material to a solid material in an uncured state, and further after curing, in a gel state, a rubbery state and a hard resinous material.

It is difficult to use a resin which becomes a gel state after curing for a reflector, but a resin which becomes a rubbery state can be molded to a reflector. When a surface-mount matrix array type reflector is molded on one surface of a metal frame using a resin which becomes rubbery after curing, modulus of elasticity is low so that warpage of the whole board seldom occurs. However, there are problems of causing malfunctions that the package or leads are easily deformed by an external force since they have low modulus of elasticity at room temperature so that wire bonding is snapped, or the interface between the reflector and an encapsulant for an LED is peeled off or the encapsulant is fractured.

On the other hand, when a reflector is produced by using a silicone resin which gives a resinous hard cured product after curing, there is a problem that the whole board is remarkably warped since its modulus of elasticity is high whereby dicing cannot be performed. Therefore, to prevent from warpage, a prescription that a large amount of inorganic filler is filled in the resin composition has generally been performed to put close the expansion coefficient to that of the metal frame. According to this method, fluidity of the resin composition is lowered, so that if a matrix array type reflector is produced by transfer molding, there is a problem that non-filling occurs.

A refractive index of a cured silicone resin itself is generally close to that of an inorganic filler, so that there causes an inconvenience that a light emitted from the light-emitting device leaks outside when a wall thickness of a reflector obtained by molding a reflector material is thin.

CITATION LIST

Patent Literature

[Patent Document 1] Japanese Patent Laid-Open Publication No. 2006-156704A
[Patent Document 2] Japanese Patent Laid-Open Publication No. 2007-329219A
[Patent Document 3] Japanese Patent Laid-Open Publication No. 2007-329249A
[Patent Document 4] Japanese Patent Laid-Open Publication No. 2008-189827A
[Patent Document 5] Japanese Patent Laid-Open Publication No. 2006-140207A
[Patent Document 6] Japanese Patent Laid-Open Publication No. 2007-235085A
[Patent Document 7] Japanese Patent Laid-Open Publication No. 2007-297601A
[Patent Document 8] Japanese Patent Laid-Open Publication No. 2009-21394A
[Patent Document 9] Japanese Patent Laid-Open Publication No. 2009-155415A

SUMMARY OF THE INVENTION

The present invention has been done in view of the above circumstances, and an object thereof is to provide a thermosetting silicone resin composition which provides a suitable cured product for a reflector, in particular, for a matrix array reflector, which is excellent in heat resistance and light resistance, and less leakage of light to outside, a reflector for an LED molded by the composition, and an optical semiconductor apparatus using the reflector for an LED.

To solve the above-mentioned problems, according to the present invention, there is provided a thermosetting silicone resin composition for a reflector of an LED wherein the thermosetting silicone resin composition comprises (A) 45 to 90 parts by mass of an organopolysiloxane represented by the following average compositional formula (1), and having at least two alkenyl groups in one molecule, $$R^1_a R^2_b R^3_c (OR^0)_d SiO_{(4-a-b-c-d)/2} \quad (1)$$

wherein $R^1$ each independently represents a substituted or unsubstituted monovalent hydrocarbon group having neither alkenyl group nor aryl group; $R^2$ represents an aryl group; $R^3$ represents an alkenyl group; $R^0$ represents a hydrogen atom, a methyl group or an ethyl group; "a" represents a number of 0.4 to 1.0; "b" represents a number of 0 to 0.5; "c" represents a number of 0.05 to 0.5; "d" represents a number of 0 to 0.5; and these numbers satisfy a+b+c+d=1.0 to 2.0, (B) 10 to 55 parts by mass of a linear organohydrogen polysiloxane represented by the following general formula (2) and/or a branched organohydrogenpolysiloxane represented by the following average compositional formula (3), which has at least two hydrogen atoms directly bonded to a silicon atom in one molecule, provided that the sum of Component (A) and Component (B) is 100 parts by mass,

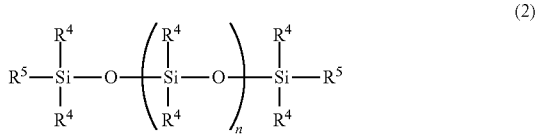

wherein $R^4$ each independently represents a substituted or unsubstituted monovalent hydrocarbon group having no alkenyl group; $R^5$ represents hydrogen; and a repeating unit "n" represents an integer of 1 to 10,

wherein $R^7$ each independently represents a substituted or unsubstituted monovalent hydrocarbon group having neither an alkenyl group nor an aryl group; $R^8$ represents an aryl group; "e" represents a number of 0.6 to 1.5; "f" represents a number of 0 to 0.5; "g" represents a number of 0.4 to 1.0; and these numbers satisfy e+f+g=1.0 to 2.5, (C) a catalytic amount of an additional reaction catalyst, (D) 3 to 200 parts by mass of a white pigment selected from titanium oxide, zinc oxide, magnesium oxide, barium carbonate, magnesium silicate, zinc sulfate and barium sulfate, and (E) 100 to 1000 parts by mass of an inorganic filler other than Component (D), and wherein an amount of Component (B) is 70% by mass or more based on a whole hydrogen atom-containing silicon compound having at least two hydrogen atoms directly bonded to a silicon atom in one molecule contained in the thermosetting silicone resin composition.

Such a thermosetting silicone resin composition for reflector of LED becomes a thermosetting silicone resin composition which provides a suitable cured product for a reflector, in particular, for a matrix array reflector, which is excellent in heat resistance and light resistance, and less leakage of light to outside.

A reflector board in which a matrix array reflector is formed by molding such a thermosetting silicone resin composition has particularly less warpage of the board, so that dicing, etc., after mounting light-emitting devices (LED devices) and encapsulating the same can be carried out easily. Moreover, after the dicing, an optical semiconductor apparatus (LED apparatus) controlled in peeling failure between the reflector surface or device surface and the encapsulating resin can be obtained.

It is also preferred that an average particle diameter of Component (D) is 0.05 to 5 μm. When the average particle diameter of Component (D) is within the range, dispersibility in the composition is more improved and light reflectance of the resulting material is also more excellent.

It is further preferred that an average particle diameter of the above-mentioned Component (E) is 1 to 20 μm. If the average particle diameter of Component (E) is within the range, leakage of light can be made less.

In addition, it is preferred that the thermosetting silicone resin composition for a reflector of an LED of the present invention further contains (F) a mold releasing agent. By adding Component (F), releasability at the time of molding is improved and production efficiency becomes more excellent.

The thermosetting silicone resin composition of the present invention is preferably a solid state at room temperature. If it is a solid state, it can be pulverized to a suitable size and a reflector can be suitably molded as a solid material by transfer molding or compression molding.

In the present invention, a reflector for an LED molded by the above-mentioned thermosetting silicone resin composition for a reflector of an LED can be also provided.

The reflector for an LED obtained by molding the above-mentioned thermosetting silicone resin composition for a reflector of an LED is excellent in heat resistance and light resistance, and is a material with less leakage of light to outside.

Further, a reflector board in which a matrix-type recessed reflector is formed by molding the above-mentioned thermosetting silicone resin composition has less warpage of the board, so that it is preferred.

In the present invention, it is also provided an optical semiconductor apparatus using the above-mentioned reflector for an LED.

The optical semiconductor apparatus using the above-mentioned reflector for an LED becomes an optical semiconductor apparatus in which peeling failure between the encapsulating resin and the reflector surface or the device surface can be controlled.

The thermosetting silicone resin composition of the present invention becomes a thermosetting silicone resin composition excellent in heat resistance and light resistance, less leakage of light to outside is a little, and giving a cured product suitable for a reflector, particularly for a matrix array reflector.

In particular, a reflector board in which a matrix array reflector is formed by molding the thermosetting silicone resin composition has less warpage of the board, so that dicing, etc., can be performed easily after mounting a light-emitting device and encapsulating the same. Moreover, after dicing, it is possible to obtain an optical semiconductor apparatus (LED apparatus) controlled in peeling failure between the reflector surface or the device surface and a sealing resin.

DESCRIPTION OF THE EMBODIMENTS

Figure 1:
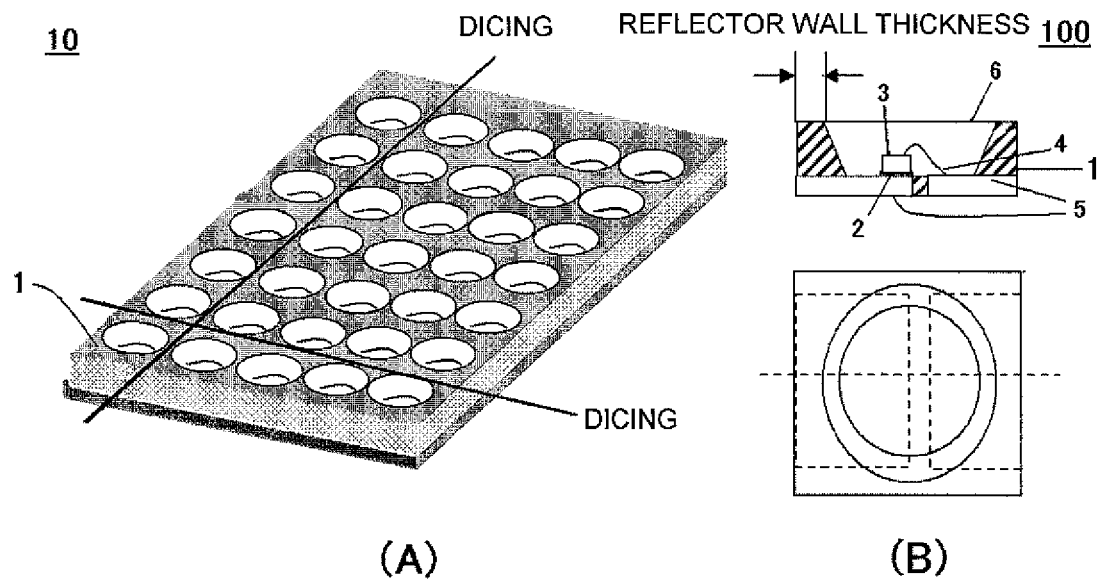
FIG. 1(A) illustrates a perspective view showing a reflector board in which a matrix-type recessed reflector is formed, which is molded by using the thermosetting silicone resin composition of the present invention.
FIG. 1(B) illustrates a top view and a sectional view of the optical semiconductor apparatus produced by using the reflector board.

In the following, the present invention will be explained in more detail.

As mentioned above, it has been desired to provide a material for a reflector which is to form a reflector for an LED, and can give a cured product excellent in heat resistance and light resistance, and less leakage of light to outside.

The present inventors have carried out intensive studies to accomplish the above-mentioned objects, and as a result, they have found that a thermosetting silicone resin composition for a reflector of an LED wherein the thermosetting silicone resin composition comprises (A) 45 to 90 parts by mass of an organopolysiloxane represented by the following average compositional formula (1), and having at least two alkenyl groups in one molecule,

$$R^1_a R^2_b R^3_c (OR^0)_d SiO_{(4-a-b-c-d)/2} \quad (1)$$

wherein $R^1$ each independently represents a substituted or unsubstituted monovalent hydrocarbon group having neither alkenyl group nor aryl group; $R^2$ represents an aryl group; $R^3$ represents an alkenyl group; $R^0$ represents a hydrogen atom, a methyl group or an ethyl group; "a" represents a number of 0.4 to 1.0; "b" represents a number of 0 to 0.5; "c" represents a number of 0.05 to 0.5; "d" represents a number of 0 to 0.5; and these numbers satisfy a+b+c+d=1.0 to 2.0, (B) 10 to 55 parts by mass of a linear organohydrogen polysiloxane represented by the following general formula (2) and/or a branched organohydrogenpolysiloxane represented by the following average compositional formula (3), which has at least two hydrogen atoms directly bonded to a silicon atom in one molecule, provided that the sum of Component (A) and Component (B) is 100 parts by mass.

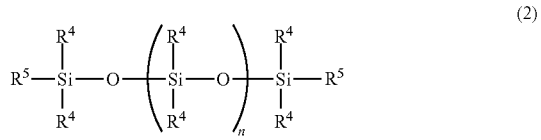

wherein $R^4$ each independently represents a substituted or unsubstituted monovalent hydrocarbon group having no alkenyl group; $R^5$ represents hydrogen; and a repeating unit "n" represents an integer of 1 to 10,

$$R^7_e R^8_f H_g SiO_{(4-e-f-g)/2} \quad (3)$$

wherein $R^7$ each independently represents a substituted or unsubstituted monovalent hydrocarbon group containing neither an alkenyl group nor an aryl group; $R^8$ represents an aryl group; "e" represents a number of 0.6 to 1.5; "f" represents a number of 0 to 0.5; "g" represents a number of 0.4 to 1.0; and these numbers satisfy e+f+g=1.0 to 2.5, (C) a catalytic amount of an addition reaction catalyst, (D) 3 to 200 parts by mass of a white pigment selected from titanium oxide, zinc oxide, magnesium oxide, barium carbonate, magnesium silicate, zinc sulfate and barium sulfate, and (E) 100 to 1000 parts by mass of an inorganic filler other than Component (D), and wherein an amount of Component (b) is 70% by mass or more based on a whole hydrogen atom-containing silicon compound having at least two hydrogen atoms directly bonded to a silicon atom in one molecule contained in the thermosetting silicone resin composition, is useful as a material of a reflector for an LED.

In the following, the present invention is explained in more detail. In the present specification, the term "room temperature" means a normal temperature which does not require heating or cooling, and generally means a temperature of 5 to 35° C.

(A) Organopolysiloxane

Component (A) is an organopolysiloxane represented by the following average compositional formula (1), having at least two alkenyl groups in one molecule,

$$R^1_a R^2_b R^3_c (OR^0)_d SiO_{(4-a-b-c-d)/2} \quad (1)$$

wherein $R^1$ each independently represents a substituted or unsubstituted monovalent hydrocarbon group having neither alkenyl group nor aryl group; $R^2$ represents an aryl group; $R^3$ represents an alkenyl group; $R^0$ represents a hydrogen atom, a methyl group or an ethyl group; "a" represents a number of 0.4 to 1.0; "b" represents a number of 0 to 0.5; "c" represents a number of 0.05 to 0.5; "d" represents a number of 0 to 0.5; and these numbers satisfy a+b+c+d=1.0 to 2.0.

In the above-mentioned formula (1), $R^0$ represents any of a hydrogen atom, a methyl group and an ethyl group.

$R^1$ each independently represents a substituted or unsubstituted monovalent hydrocarbon group having neither alkenyl group nor aryl group, and having preferably 1 to 10 carbon atoms, particularly preferably 1 to 6 carbon atoms. Examples of such an $R^1$ may include an alkyl group such as a methyl group, an ethyl group, a propyl group, an isopropyl group, a butyl group, an isobutyl group, a tert-butyl group, a pentyl group, a neopentyl group, a hexyl group, an octyl group, a nonyl group and a decyl group; an aralkyl group such as a benzyl group, a phenylethyl group and a phenylpropyl group; and those in which a part or whole of the hydrogen atoms of these groups is/are substituted by a halogen atom such as fluorine, bromine and chlorine, a cyano group, and so on, including a halogen-substituted alkyl group such as a chloromethyl group, a chloropropyl group, a bromoethyl group and a trifluoropropyl group, and a cyanoethyl group. Among them, a methyl group is preferred.

$R^2$ in the above-mentioned formula (1) is an aryl group, preferably those having 6 to 10 carbon atoms. A phenyl group, a tolyl group, a xylyl group and a naphthyl group, preferably a phenyl group are exemplified. In the above formula (1), b/(a+b+c+d) is preferably 0.1 to 0.5.

$R^3$ in the above-mentioned formula (1) is an alkenyl group, preferably an alkenyl group having 2 to 8 carbon atoms, more preferably 2 to 6 carbon atoms. Examples of such $R^3$ may include a vinyl group, an allyl group, a propenyl group, an isopropenyl group, a butenyl group, a hexenyl group, a cyclohexenyl group and an octenyl group, and so on. Among them, a vinyl group or an allyl group is particularly preferred.

Component (A) in the thermosetting silicone resin composition of the present invention is preferably those mainly comprising a resin structure (i.e., three-dimensional net-work structure) organopolysiloxane.

The resin structure organopolysiloxane is an organopolysiloxane containing a branched structure, i.e., a tri-functional siloxane unit and/or a tetra-functional siloxane unit. Preferred is an organopolysiloxane comprising a $R^{101}SiO_{1.5}$ unit, a $R^{100}_k R^{101}_p SiO$ unit and a $R^{100}_q R^{101}_r SiO_{0.5}$ unit (in the above formulae, $R^{100}$ represents a vinyl group or an allyl group, represents the same group as the above-mentioned $R^1$ and $R^2$ (preferably a phenyl group). "k" represents an integer of 0 or 1, "p" represents an integer of 1 or 2, provided that k+p=2, "q" represents an integer of 1 to 3, "r" represents an integer of 0 to 2, provided that q+r=3).

The resin structure organopolysiloxane is preferably constituted of, when a $R^{101}SiO_{1.5}$ unit is mentioned as a T unit, a $R^{100}_k R^{101}_p SiO$ unit as a D unit, and a $R^{100}_q R^{101}_r SiO_{0.5}$ unit as a M unit, in a molar ratio, (D+M)/T=0.01 to 1, preferably 0.1 to 0.5, and M/T=0.05 to 3, preferably 0.1 to 0.5. The organopolysiloxane suitably has a weight average molecular weight in terms of a polystyrene measured by GPC (gel permeation chromatography) in the range of 500 to 10,000.

The resin structure organopolysiloxane may further contain other bi-functional siloxane unit, tri-functional siloxane unit, tetra-functional siloxane unit in addition to the above-mentioned T unit, D unit and M unit with a little amount.

The resin structure organopolysiloxane can be easily synthesized by combining the compounds which become unit sources of the above-mentioned T unit, unit and M unit with such amounts that they satisfy the above-mentioned molar ratio, and then, for example, subjecting to co-hydrolysis in the presence of an acid.

A silanol amount is desirably 2% or more.

As the T unit source, there may be used phenyltrichlorosilane, phenyltrimethoxysilane, phenyltriethoxysilarie, cyclohexyltrichlorosilane, cyclohexyltrimethoxysilane, cyclohexyltriethoxysilane, cyclopentyltrichlorosilane, n-propyltrichlorosilane, methyltrichlorosilane, methyltrimethoxysilane and methyltriethoxysilane.

As the D unit source, there may be used the following materials.

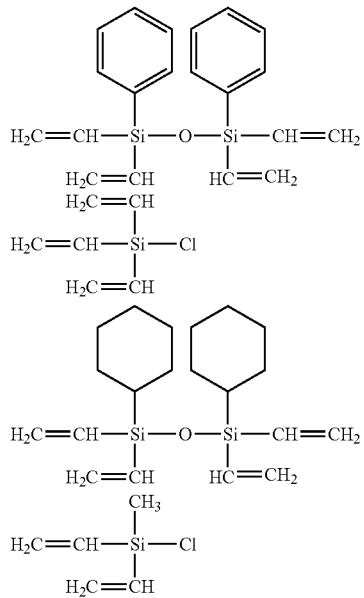

As the M unit source, there may be used the following materials.

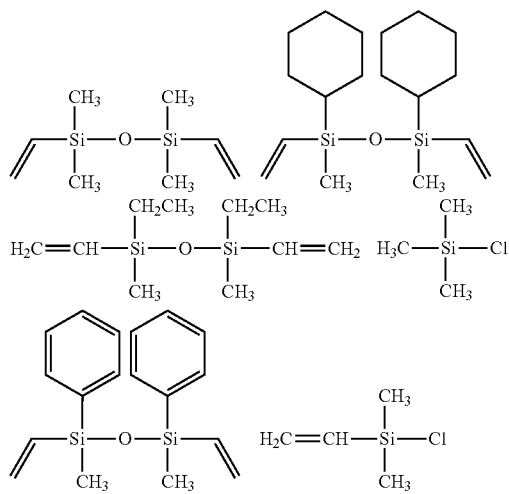

The resin structure organopolysiloxane has an effect of improving physical strength of the cured product. The resin structure organopolysiloxane is preferably blended in an amount of 20 to 100% by mass in Component (A), more preferably 50 to 100% by mass.

If the blending amount of the resin structure organopolysiloxane is 20 to 100% by mass, a shape-retaining property as a reflector becomes more excellent.

Also, the organopolysiloxane preferably contains at least 0.01% by mass of a silicon-bonded hydroxyl group (Si—OH) to improve wetting with an inorganic filler surface mentioned below. If it is 0.01% by mass or more, wetting property with the inorganic filler is improved, so that strength of the product is excellent under high humidity and high temperature. The amount of the silicon-bonded hydroxyl group is further preferably 0.05% by mass or more.

In addition, the following organopolysiloxane other than the above-mentioned resin structure organopolysiloxane can be optionally blended for the purpose of providing suitable flexibility or low elasticity to the cured product.

As the other organopolysiloxane than the above-mentioned resin structure organopolysiloxane, there may include an organopolysiloxane having a linear structure in which the main chain consists of repeating diorganosiloxane units ($R_2SiO_{2/2}$ unit), and the both terminals of the molecular chain are sealed by the triorganosiloxy groups ($R_3SiO_{1/2}$ unit) (wherein R means the same group as that of $R^1$, $R^2$, or $R^3$).

Of these, the linear organopolysiloxane having each one or more vinyl groups at the both terminals represented by the following formula (4), and a viscosity at 25° C. of 10 to 1,000,000 mPa·s, preferably 1,000 to 50,000 mPa·s is preferred in the viewpoints of workability and curability. The viscosity can be measured by, for example, a rotational viscometer.

(4)

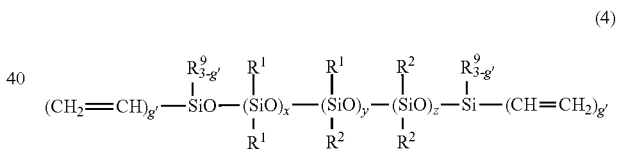

wherein $R^1$ and $R^2$ are as defined above; $R^9$ represents the same as the above-mentioned $R^1$ or $R^2$; and "g'" represents an integer of 1, 2 or 3.

In the above formula (4), repeating units "x", "y" and "z" are 0 or a positive integers satisfying $1 \le x+y+z \le 1{,}000$, preferably $5 \le x+y+z \le 500$, more preferably $30 \le x+y+z \le 500$, provided that these are integers satisfying $0.5 < (x+y)/(x+y+z) \le 1.0$.

The organopolysiloxane represented by the above-mentioned formula (4) may be specifically mentioned the following,

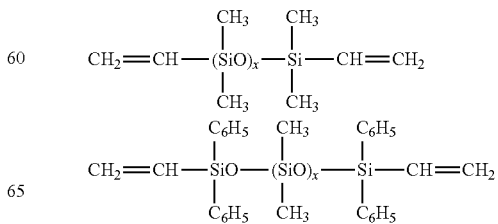

-continued

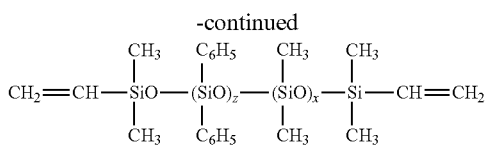

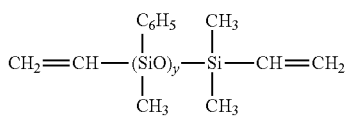

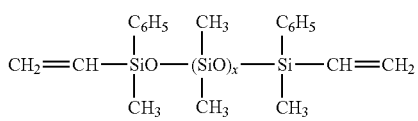

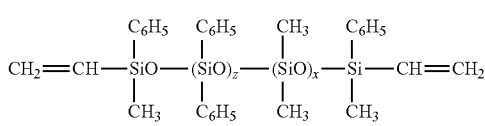

wherein x, y and z have the same meanings as mentioned above.

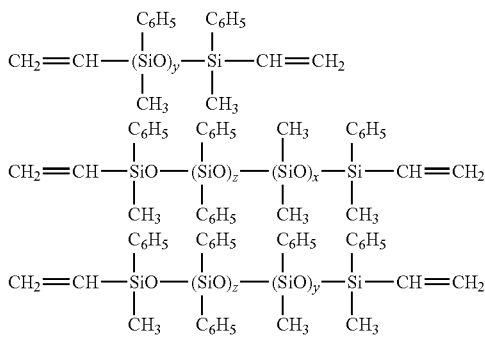

The amount of the organopolysiloxane having the above-mentioned linear structure to be added is preferably 0 to 80 parts by mass, particularly preferably 0 to 50 parts by mass.

The blending amount of Component (A) is 45 to 90 parts by mass, preferably 60 to 90 parts by mass based on 100 parts by mass of the sum of Component (A) and the following mentioned Component (B).

(B) Organohydrogenpolysiloxane

The organohydrogenpolysiloxane of Component (B) has at least two hydrogen atoms directly bonded to the silicon atom in one molecule, acts as a cross-linking agent, and can be classified into two, that is, one of which is a linear one and the other is a branched one. The hydrosilyl group in said Component (B) and the alkenyl group in (A) organopolysiloxane are allowed to addition reaction to form a cross-linking structure. Component (B) may be used a single kind or in combination of two or more kinds depending on the characteristics to be obtained.

Among Component (B), the linear organohydrogenpolysiloxane is represented by the following formula (2),

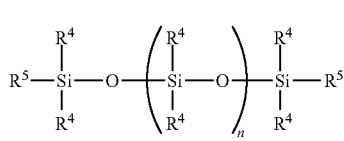

(2)

wherein $R^4$ each independently represents a substituted or unsubstituted monovalent hydrocarbon group having no alkenyl group, $R^5$ represents hydrogen, and a repeating unit "n" represents an integer of 1 to 10, preferably an integer of 1 to 4. If n of Component (B) is 0, it volatiles at the time of curing by heating so that curing failure sometimes occurs, while if it exceeds 10, cross-linking efficiency sometimes lowers.

In the above formula (2), $R^4$ each independently represents a substituted or unsubstituted monovalent hydrocarbon group having no alkenyl group, and those having 1 to 10 carbon atoms, particularly those having 1 to 6 carbon atoms are preferred. Examples of such $R^4$ may include an alkyl group such as a methyl group, an ethyl group, a propyl group, an isopropyl group, a butyl group, an isobutyl group, a tert-butyl group, a pentyl group, a neopentyl group, a hexyl group, an octyl group, a nonyl group and a decyl group; an aryl group such as a phenyl group, a tolyl group, a xylyl group and a naphthyl group; an aralkyl group such as a benzyl group, a phenylethyl group and a phenylpropyl group; and those in which a part or whole of the hydrogen atoms of these groups is/are substituted by a halogen atom such as fluorine, bromine and chlorine, a cyano group, and so on, including a halogen-substituted alkyl group such as a chloromethyl group, a chloropropyl group, a bromoethyl group and a trifluoropropyl group, and a cyanoethyl group. Among them, a methyl group and a phenyl group are preferred. In addition, it is preferred that 10 mol % or more of $R^4$ is a phenyl group.

Such a linear organohydrogen polysiloxane can be prepared by the conventionally known method, and, for example, it can be synthesized by subjecting a siloxane having a SiH group and a dialkoxysilane to acid equilibrium reaction in the presence of a strong acid catalyst.

Examples of such a linear organohydrogen polysiloxane may include that shown by the following formula,

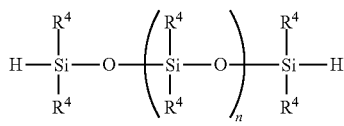

wherein n represents as mentioned above.

Among Component (B), the branched organohydrogenpolysiloxane is represented by the following average compositional formula (3),

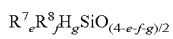 (3)

wherein $R^7$ each independently represents a substituted or unsubstituted monovalent hydrocarbon group having neither an alkenyl group nor an aryl group; $R^8$ represents an aryl group; "e" represents a number of 0.6 to 1.5, "f" represents 0 to 0.5, "g" represents 0.4 to 1.0, and these numbers satisfy e+f+g=1.0 to 2.5.

In the above formula (3), $R^7$ represents a monovalent hydrocarbon group having neither an alkenyl group nor an aryl group, preferably having 1 to 10 carbon atoms, particularly preferably 1 to 7 carbon atoms. Examples of such $R^7$ may include an alkyl group such as a methyl group, an ethyl group, a propyl group, an isopropyl group, a butyl group, an isobutyl group, a tert-butyl group, a pentyl group, a neopentyl group, a hexyl group, an octyl group, a nonyl group and a decyl group; a halogen-substituted alkyl group such as a chloromethyl group, a chloropropyl group, a bromoethyl group and a trifluoropropyl group and a cyanoethyl group.

In the above-mentioned average compositional formula (3), $R^8$ represents an aryl group, preferably having 6 to 10 carbon atoms, and a phenyl group, a tolyl group, a xylyl group and a naphthyl group, and a phenyl group is preferably exemplified. "e" represents a number of 0.6 to 1.5, "f" represents 0 to 0.5, and "g" represents 0.4 to 1.0, and these numbers satisfy e+f+g=1.0 to 2.5. Also, f/(e+f+g) is preferably 0.05 or more, particularly preferably 0.1 or more.

The position of the hydrosilyl group in the molecule is not particularly limited, and may be at the terminal of the molecular chain or during the molecular chain.

Examples of such a branched organohydrogenpolysiloxane may include tris(dimethylhydrogensiloxy)methylsilane, tris-(dimethylhydrogensiloxy)phenylsilane, 1,1,3,3-tetramethyldisiloxane, 1,3,5,7-tetramethylcyclotetrasiloxane, both-terminals trimethylsiloxy group-sealed methylhydrogenpolysiloxane, both-terminals trimethylsiloxy group-sealed dimethylsiloxane•methylhydrogensiloxane copolymer, both-terminals dimethylhydrogensiloxy group-sealed dimethylsiloxane•methylhydrogensiloxane copolymer, both-ends trimethylsiloxy group-sealed methylhydrogensiloxane•diphenylsiloxane copolymer, both-terminals trimethylsiloxy group-sealed methylhydrogensiloxane•diphenylsiloxane•dimethylsiloxane copolymer, a copolymer consisting of a $(CH_3)_2HSiO_{1/2}$ unit and a $SiO_{4/2}$ unit, and a copolymer consisting of a $(CH_3)_2HSiO_{1/2}$ unit, a $SiO_{4/2}$ unit and a $(C_6H_5)SiO_{3/2}$ unit.

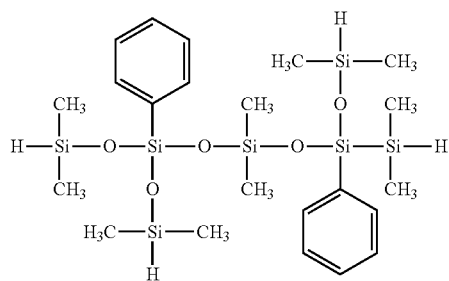

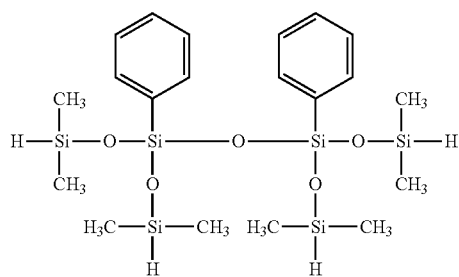 [SMILES: C[SiH](C)O[Si](O[SiH](C)C)(O[Si](O[SiH](C)C)(O[SiH](C)C)c1ccccc1)c1ccccc1]

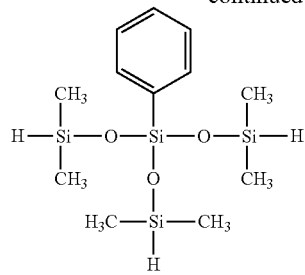

-continued

Such a branched organohydrogenpolysiloxane can be prepared by the conventionally known method and can be obtained by, for example, hydrolyzing a chlorosilane represented by $RSiHCl_2$, $R_3SiCl$, $R_2SiCl_2$ or $R_2SiHCl$ (wherein R has the same meaning as the group of the above-mentioned $R^7$ or $R^8$), or equilibrating the siloxane obtained by hydrolysis using a strong acid catalyst.

The organohydrogenpolysiloxanes of Component (B) are represented by the above-mentioned general formulae (2) and (3), and these may be used alone or in combination thereof in admixture in the present invention. A preferred ratio of the organohydrogenpolysiloxanes represented by the above-mentioned general formulae (2) and (3) to be used is 0:100 to 60:40, more preferably 10:90 to 50:50.

The blending amount of Component (3) is 10 to 55 parts by mass based on 100 parts by mass of the sum of Components (A) and (B), preferably 10 to 40 parts by mass. The blending amount of Component (B) is an amount effective for curing Component (A), and the total equivalents of the hydrosilyl groups in Component (B) is preferably 0.5 to 4.0 equivalents, more preferably 0.8 to 2.0 equivalents, further preferably 0.9 to 1.5 equivalents based on 1 equivalent of the alkenyl group in Component (A). If it is within the range of 0.5 to 4.0 equivalents, curing characteristics become more excellent.

The thermosetting silicone resin composition of the present invention may contain a hydrogen atom-containing silicon compound having at least two hydrogen atoms directly bonded to a silicon atom in one molecule other than Component (B), and the blending amount of Component (B) is required to be 70% by mass or more among the whole hydrogen atom-containing silicon compound having at least two hydrogen atoms directly bonded to a silicon atom in one molecule contained in the thermosetting silicone resin composition of the present invention.

The thermosetting silicone resin composition of the present invention preferably contains an aryl group in an amount of 10 to 60% by mass, particularly 15 to 60% by mass based on the total mass of Component (A) and Component (B). Examples of the aryl group may include a phenyl group, a tolyl group, a xylyl group and a naphthyl group, and among them, a phenyl group is preferred. If the amount of the aryl group is 10% by mass or more and 60% by mass or less, there is no fear of worsening reliability of the resulting optical semiconductor apparatus so that it is preferred.

A reflector package (reflector board) produced by using the conventional silicone resin or epoxy resin is warped due to the stress at the time of curing of the silicone resin, etc., so that the subsequent steps of mounting LED devices, wire bonding and dicing could not be carried out by a MAP (Mold Array Package) system.

To reduce warpage of the reflector board, in the thermosetting silicone resin composition for molding a reflector for an LED of the present invention, a ratio of modulus of elasticity (modulus of elasticity of the glass transition temperature or higher/modulus of elasticity of the glass transition temperature or less) of the cured product can be controlled with the glass transition temperature (Tg) as a boarder by changing the mixing ratio of the organopolysiloxane of Component (A) which is a main component and the organohydrogenpolysiloxanes represented by the above-mentioned general formula (2) and by the above-mentioned average compositional formula (3) of Component (B).

In particular, the cured product of the thermosetting silicone resin composition of the present invention preferably has a ratio of the modulus of elasticity at the glass transition temperature (Tg) −25° C. and the modulus of elasticity at the glass transition temperature (Tg) +25° C. (modulus of elasticity at Tg+25° C./modulus of elasticity at Tg−25° C.) of 2.0 to 5.0.

If the above ratio of the modulus of elasticity is 2.0 or more, there is no fear that the mechanical strength cannot be maintained by the cured product becoming too soft at the glass transition temperature or higher, while if it is 5.0 or less, there is no fear that warpage becomes too remarkable by the modulus of elasticity becoming too high at the region of the glass transition temperature or higher.

(C) Addition Reaction Catalyst

The addition reaction catalyst of Component (C) is to be blended to promote the above-mentioned addition reaction of Component (A) and Component (B). As the addition reaction catalyst, a platinum series, a palladium series, and a rhodium series catalyst can be used, and a platinum group metal-based catalyst is preferred in the viewpoint of a cost, etc. Examples of the platinum group metal-based catalyst may include $H_2PtCl_6.mH_2O$, $K_2PtCl_6$, $KHPtCl_6.mH_2O$, $K_2PtCl_4$, $K_2PtCl_4.mH_2O$ and $PtO_2.mH_2O$ (m represents a positive integer). In addition, a complex of the above-mentioned platinum group metal catalyst and a hydrocarbon such as an olefin, an alcohol or a vinyl group-containing organopolysiloxane may be used. The above-mentioned catalyst may be used alone or in combination of two or more kinds.

The catalyst may be blended with the so-called catalytic amount. When the platinum group metal-based catalyst is to be used, it is preferably 0.0001 to 0.2 parts by mass, more preferably 0.0001 to 0.05 parts by mass in terms of a platinum group metal (mass) based on 100 parts by mass of the sum of the above-mentioned Components (A) and (B).

(D) White Pigment

Component (D) is a white pigment selected from titanium oxide, zinc oxide, magnesium oxide, barium carbonate, magnesium silicate, zinc sulfate and barium sulfate. The white pigment of Component (D) is to be blended as a white colorant to heighten brightness, and to improve reflection efficiency. The average particle diameter and the shape thereof are also not limited, and an average particle diameter which is a weight average diameter $D_{50}$ (or median size) in a particle size distribution measurement by laser diffraction analysis is preferably 0.05 to 5.0 μm. These may be used alone or in combination of several kinds. Among the above-mentioned pigments, titanium dioxide is preferred, and a unit lattice of the titanium dioxide may be either a rutile-type, an anatase-type or a brookite-type one.

The above-mentioned titanium dioxide can be previously subjected to surface treatment by a hydrous oxide of Al or Si to heighten compatibility or dispersibility with a rein or an inorganic filler.

The blending amount of the white pigment is 3 to 200 parts by mass, and more desirably 5 to 150 parts by mass based on 100 parts by mass of the sum of the above-mentioned Components (A) and (B). If it is less than 3 parts by mass, sufficient brightness cannot be obtained in some cases. If it exceeds 200 parts by mass, not only the ratio of the other component to be added for the purpose of improving mechanical strength becomes a little but also moldability is markedly lowered in some cases. The white pigment is preferably 1 to 50% by mass based on the whole thermosetting silicone resin composition of the present invention, particularly preferably in the range of 3 to 30% by mass.

(E) Inorganic Filler

To the thermosetting silicone resin composition of the present invention, an inorganic filler other than the above-mentioned Component (D) is added as Component (E) for the purpose of lowering expansion or improving strength of the cured product. Here, the thermosetting silicone resin composition of the present invention is a material to mold a reflector for an LED, so that light emitted from the LED must not leak to outside through the reflector. Also, light reflected to the wall of the reflector shall be reflected as much as possible and is required to exit the outside of the reflector.

When the silicone resin composition is used as a resin for a reflector, a thickness of a wall of the reflector and a particle diameter of the filler are also related, and by making the maximum particle diameter of the filler to the wall thickness ½ or less, leakage of light can be made a little. Therefore, the inorganic filler of Component (E) is preferably an inorganic filler having ½ or less of the particle diameter based on the wall thickness of the reflector. The wall thickness of the reflector is generally 100 μm or less in many cases, so that the maximum particle diameter is desirably 50 μm or less, and an average particle diameter is preferably 1 to 20 μm, more preferably 1 to 10 μm. If the average particle diameter is 20 μm or less, leakage of light becomes less, and if it is 1 μm or more, moldability and workability of the composition are more improved. It is also preferred that the content of the particles exceeding 50 μm is 1% by mass or less.

The average particle diameter can be determined as a weight average diameter $D_{50}$ (or median size) in a particle size distribution measurement by laser diffraction analysis.

The inorganic filler of Component (E) satisfying the above-mentioned conditions may include, for example, fine powder silica, fine powder alumina, fused silica, crystalline silica, cristobalite, alumina, aluminum silicate, titanium silicate, silicon nitride, aluminum nitride, boron nitride and antimony trioxide. Moreover, it is also possible to use a fibrous inorganic filler such as glass fiber and wollastonite. Among these, fused silica and crystalline silica are preferred.

The amount of the inorganic filler to be filled is 100 to 1000 parts by mass, particularly preferably 600 to 950 parts by mass based on 100 parts by mass of the sum of Components (A) and (B). If it is less than 100 parts by mass, sufficient strength cannot necessarily be obtained or thermal expansion of the cured product sometimes becomes large, while if it exceeds 1000 parts by mass, failure such as peeling in the device sometimes occurs by failure of non-filling due to increase in viscosity or loosing flexibility. The inorganic filler is preferably 10 to 90% by mass based on the whole thermosetting silicone resin composition, more preferably in the range of 20 to 80% by mass.

(F) Mold Releasing Agent

A mold releasing agent is preferably blended in the thermosetting silicone resin composition of the present invention.

By adding Component (F), releasability at the time of molding can be heightened and workability can be improved. Examples of the mold releasing agent may include natural wax, and synthetic waxes such as acid wax, polyethylene wax and fatty acid wax. More specifically, RIKESTAR EW 440A (product of RIKEN VITAMIN CO., LTD.), etc., are exemplified. The blending amount of Component (F) is preferably 0.01 to 3.0 parts by mass, particularly preferably 0.05 to 1.0 parts by mass based on 100 parts by mass of the sum of Components (A) and (B).

Other Additives

To the thermosetting silicone resin composition of the present invention, various kinds of additives may be added.

For example, a reaction inhibitor may be blended for the purpose of improving storage stability. The reaction inhibitor may be any conventionally known material so long as it controls the addition reaction promoted by the above-mentioned platinum group metal-based catalyst, and may include, for example, a compound selected from the group consisting of an organopolysiloxane having vinyl groups with a higher degree such as tetramethyltetravinylcyclotetrasiloxane, vinylsilane, triallyl isocyanurate, alkyl maleate, acetylene alcohols and silane-modified products thereof and siloxane-modified products thereof, hydroperoxides, tetramethylethylenediamine, benzotriazole and a mixture of the above. The reaction inhibitor may be used alone or in combination of two or more kinds. The blending amount of the reaction inhibitor is desirably within the range of 0.001 to 5 parts by mass, more desirably within the range of 0.005 to 1 parts by mass based on 100 parts by mass of the sum of Components (A) and (B).

To the thermosetting silicone resin composition of the present invention, an adhesive tackifier may be blended. The adhesive tackifier may include vinyltri-methoxysilane, vinyltriethoxysilane, 2-(3,4-epoxycyclo-hexyl)ethyltrimethoxysilane, 3-glycidoxypropyltrimethoxysilane, 3-glycidoxypropylmethyldiethoxysilane, 3-glycidoxypropyltriethoxysilane, 3-methacryloxy propylmethyldimethoxysilane, 3-methacryloxy propyltrimethoxysilane, 3-methacryloxy propylmethyldiethoxysilane, 3-methacryloxy propyltriethoxysilane, N-2(aminoethyl) 3-aminopropyl-methyldimethoxysilane, N-2(aminoethyl) 3-aminopropyl-trimethoxysilane, N-2(aminoethyl) 3-aminopropyltri-ethoxysilane, 3-aminopropyltrimethoxysilane, 3-aminopropyltriethoxysilane, N-phenyl-3-aminopropyltri-methoxysilane, 3-mercaptopropyltrimethoxysilane, etc., are trimethoxysilane, tetramethylsilane, phenyltrimethoxysilane, diphenyldimethoxysilane and their oligomers. These adhesive tackifiers may be used alone or in combination of two or more kinds. The adhesive tackifier is preferably blended in an amount of 0.001 to 10 parts by mass, particularly preferably 0.01 to 5 parts by mass based on 100 parts by mass of the sum of Components (A) and (3).

Moreover, for the purpose of improving properties of the resin, various kinds of additives such as silicone powder, a thermoplastic resin, a thermoplastic elastomer and an organic synthetic rubber may be added.

Preparation Method of Thermosetting Silicone Resin Composition

As the preparation method of the thermosetting silicone resin composition of the present invention, Component (A), Component (B), Component (C), Component (D) and Component (E) are blended with the predetermined compositional ratio, and the mixture is sufficiently and uniformly mixed by a mixer, etc., to obtain the composition. A composition which is a solid at room temperature can be prepared by blending Component (A), Component (B), Component (C), Component (D) and Component (E) with the predetermined compositional ratio, and after the mixture is sufficiently and uniformly mixed by a mixer, etc., it is subjected to melt blending treatment by a hot roller, kneader or extruder, then, cooled and solidified, and pulverized to a suitable size to give a thermosetting silicone resin composition which is a solid at room temperature.

Reflector for an LED

The thermosetting silicone resin composition of the present invention is a thermosetting silicone resin composition for molding a reflector for an LED, and the most general process for molding reflectors for an LED may include transfer molding or compression molding.

Molding of reflectors by the transfer molding is preferably performed, by using a transfer molding machine, at a molding pressure of 5 to 20 N/mm$^2$, a molding temperature of 120 to 190° C. and a molding time of 30 to 500 seconds, particularly preferably at a molding temperature of 120 to 160° C. and a molding time of 30 to 300 seconds.

Molding of reflectors by the compression molding is preferably performed, by using a compression molding machine, at a molding temperature of 120 to 190° C. and a molding time of 30 to 600 seconds, particularly preferably at a molding temperature of 120 to 160° C. and a molding time of 120 to 420 seconds.

Moreover, in either of the molding methods, postcure may be conducted at 150 to 200° C. for 1 to 20 hours.

As illustrated in FIG. 1(A), a reflector board 10 on which a matrix-type recessed reflector 1 is formed by molding the above-mentioned thermosetting silicone resin composition of the present invention can be produced. Also, as illustrated in FIG. 2(A), a reflector board 10' on which a matrix-type flat-plate reflector 1' is formed by molding the above-mentioned thermosetting silicone resin composition of the present invention can be produced.

Optical Semiconductor Apparatus

By using the above-mentioned reflector for an LED, an optical semiconductor apparatus can be produced.

Figure 2:
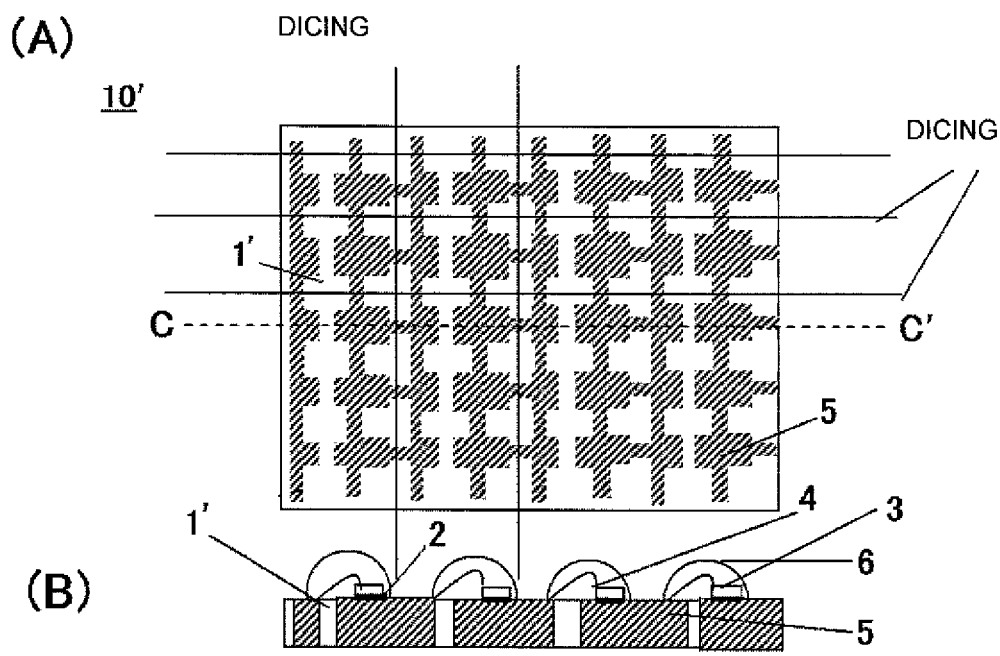
FIG. 2(A) illustrates a top view showing a reflector board in which a matrix-type flat-plate reflector is formed, which is molded by using the thermosetting silicone resin composition of the present invention.
FIG. 2(B) illustrates a sectional view of a reflector board on which a light-emitting device is mounted and sealed.

More specifically, when the reflector boards 10 on which the matrix-type recessed reflector 1 has been formed as illustrated in FIG. 1 are to be used, before cutting the matrix-state reflector boards 10, a light-emitting device 3 (LED devices) is fixed on a die pad 2 existing at the respective recessed portions (device-mounting area) of the reflector boards 10 by using a silicone die-bonding agent (LPS-8445S, manufactured by Shin-Etsu Chemical Co., Ltd.), and the light-emitting device 3 is adhered by heating at 150° C. for 1 hour. Then, the light-emitting device 3 and a lead frame 5 are electrically connected by gold wires 4. Thereafter, a transparent silicone resin 6 in which a transparent silicone resin (LPS5547, product of Shin-Etsu Chemical Co., Ltd.) and a phosphor, etc. are blended is poured into the recessed portions of the reflector boards 10 by potting, and encapsulated by heating and curing at 80° C. for 1 hour, and further at 150° C. for 2 hours. Encapsulation of the transparent silicone resin 6 can be performed by the method by potting, or according to the encapsulating method such as transfer molding and compression molding, it can be formed to a lens shape, etc., simultaneously.

When the reflector boards 10' in which a matrix-type flat-plate reflector 1' had been formed as illustrated in FIG. 2(A) are to be used, before cutting the reflector boards 10', a light-emitting device (LED devices) 3 is fixed on a respective die pad 2 existing on the reflector boards 10' by using a silicone die-bonding agent (tPS-8445S, product of Shin-Etsu Chemical Co., Ltd.), and the light-emitting device 3 is adhered by heating at 150° C. for 1 hour. Then, the light-emitting device 3 and a lead frame 5 are electrically connected by gold wires 4. Thereafter, a transparent silicone resin 6 in which a transparent silicone resin (LPS5547, product of Shin-Etsu Chemical Co., Ltd.) and a phosphor, etc. are blended is molded by transfer molding or compression molding under the curing conditions of 120° C. for 3 minutes in a lens shape to encapsulate the devices, and further cured by heating at 150° C. for 2 hours. The C—C' sectional view of the reflector boards 10' after mounting and encapsulating the light-emitting devices 3 is illustrated in FIG. 2(B).

Then, either of the reflector boards 10 and 10' which the light-emitting devices is mounted and encapsulated is cut by dicing, laser machining, water-jet machining, etc., to be discrete and piece to obtain an optical semiconductor apparatus. FIG. 1(B) illustrates a top view and a sectional view of the optical semiconductor apparatus 100 obtained by dicing the reflector boards 10 in which light-emitting devices had been mounted and encapsulated in the recessed portion.

Figure 3:
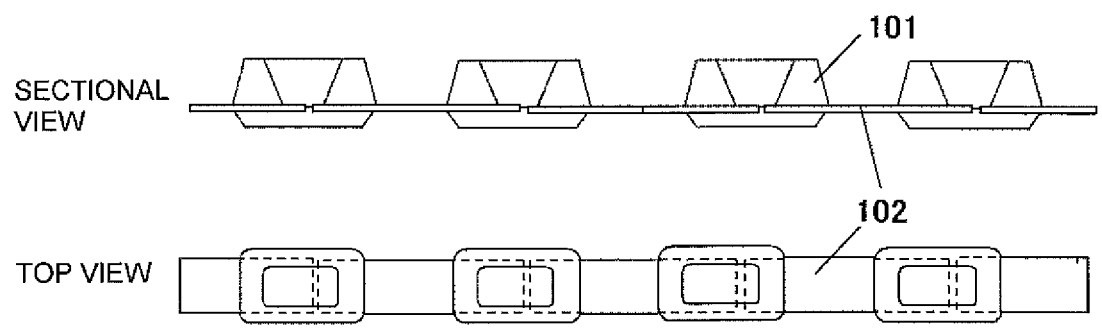
FIG. 3 illustrates a sectional view and a top view of a discrete-type reflector which is molded by using the thermosetting silicone resin composition of the present invention.

There is no problem even when the discrete-type reflector 101 illustrated in FIG. 3 is molded by using the thermosetting silicone resin composition of the present invention. The reference numeral 102 illustrates a lead frame.

By using the reflector for an LED molded by the thermosetting silicone resin composition of the present invention, adhesion between the reflector surface and the transparent silicone resin which is an encapsulating resin becomes firm, and there is no deterioration of the reflector surface due to light, so that reliability of the optical semiconductor apparatus (LED apparatus) is markedly improved.

EXAMPLES

In the following, the present invention will be described specifically based on Examples and Comparative Examples, but the present invention is not limited to the following Examples. In the following descriptions, all "parts" mean "parts by mass".

Starting materials used in Examples and Comparative Examples are shown below.

(A) Organopolysiloxane having alkenyl group

Synthesis Example 1

Synthesis of Organopolysiloxane (A-1)

In a flask were charged 1000 g of xylene and 5014 g of water, and a mixture comprising 2285 g (10.8 mol) of phenyltrichlorosilane, 326 g (2.70 mol) of vinyldimethylchlorosilane and 1478 g of xylene was added dropwise thereto. After completion of the dropwise addition, the mixture was stirred for 3 hours, waste acid was separated and the resulting mixture was washed with water. After azeotropic dehydration, 6 g (0.15 mol) of KOH was added to the mixture, and the resulting mixture was refluxed at 150° C. overnight. The mixture was neutralized with 27 g (0.25 mol) of trimethylchlorosilane and 24.5 g (0.25 mol) of potassium acetate, and after filtration, the solvent was distilled away under reduced pressure to synthesize Organopolysiloxane (A-1) which was transparent and solid state at room temperature. The vinyl equivalent was 0.0013 mol/g, and the hydroxyl group content was 0.01% by mass. The softening point was 65° C.

Synthesis Examples 2 to 4

Syntheses of Organopolysiloxanes (A-2) to (A-4)

Hydrolysis was carried out under the same blending and conditions as in Synthesis Example 1, after azeotropic dehydration, KOH with an amount shown in Table 1 was added, and heating reflux and neutralization treatment were carried out to obtain Organopolysiloxanes (A-2, A-3 and A-4). The results are shown in Table 1.

TABLE 1

|  | Synthesis Example | | | |
|---|---|---|---|---|
|  | 1 | 2 | 3 | 4 |
| Organopolysiloxane | (A-1) | (A-2) | (A-3) | (A-4) |
| KOH amount | 6 g (0.15 mol) | 3 g (0.075 mol) | 0.76 g (0.0135 mol) | 0.51 g (0.0091 mol) |
| Softening point (° C.) | 65 | 60 | 58 | 56 |
| OH group amount (% by mass) | 0.01 | 0.05 | 0.1 | 0.2 |

Synthesis Example 5

Synthesis of organopolysiloxane (A-5)

In a flask were charged 1000 g of xylene and 5014 g of water, and a mixture comprising 2285 g (10.8 mol) of phenyltrichlorosilane, 300 g (2.3 mol) of dimethyldichlorosilane, 100 g (0.72 mol) of methylvinyldichlorosilane, 326 g (2.70 mol) of vinyldimethylchlorosilane and 1478 g of xylene was added dropwise thereto. After completion of the dropwise addition, the mixture was stirred for 3 hours, waste acid was separated and the resulting mixture was washed with water. After azeotropic dehydration, 0.5 g (0.0125 mol) of KOH was added to the mixture, and the resulting mixture was refluxed at 150° C. overnight. The mixture was neutralized with 27 g (0.25 mol) of trimethylchlorosilane and 24.5 g (0.25 mol) of potassium acetate, and after filtration, the solvent was distilled away under reduced pressure to synthesize Organopolysiloxane (A-5) which was transparent and had high viscosity at room temperature. The vinyl equivalent was 0.0018 mol/g.

As Organopolysiloxane (A-6), the linear siloxane represented by the following average compositional formula was used.

Linear siloxane (A-6) average compositional formula: $CH_2=CH—Si(CH_3)_2O—(—Si(CH_3)_2O—)_{35}—(Si(CH_3)(CH=CH_2)O—)_5—(Si(CH_3)(C_6H_6)O—)_{10}—Si(CH_3)_2—CH=CH_2$ Vinyl group equivalent was 0.0015 mol/g.

(B) Organohydrogenpolysiloxane

As the cross-linking agent, the organohydrogenpolysiloxane having the following structure was used. The following mentioned organohydrogenpolysiloxane (B-2) is a hydrogen atom-containing silicon compound having at least two hydrogen atoms directly bonded to a silicon atom in one molecule other than Component (B) of the present invention.

Organohydrogenpolysiloxane (B-1):

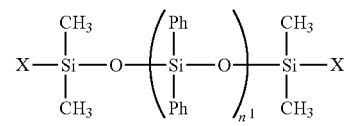

0.00377 mol/g
($n^1$=2.0 (average value)) X: a hydrogen atom, SiH group equivalent was 0.403. Ph represents a phenyl group.)

Organohydrogenpolysiloxane (B-2):

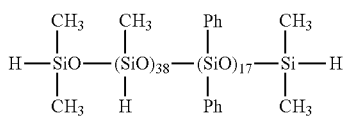

0.0069 mol/g
Organohydrogenpolysiloxane (B-3):

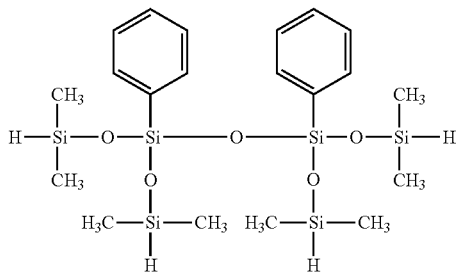

0.0076 mol/g (C) Addition Reaction Catalyst

As the addition reaction catalyst, an octyl alcohol-modified solution of chloroplatinic acid (platinum concentration: 2% by mass) was used.

(D) White pigment (1) Titanium oxide: rutile type, average particle diameter: 0.28 μm (CR-95: product of Ishiahara Sangyo Kaisha Ltd.)
(2) Zinc oxide (product of Mitsui Mining & Smelting Co., Ltd.)
(3) Magnesium oxide (product of WAKO-Chemicals, average particle diameter: 10 μm)
(4) Barium carbonate (product of WAKO-Chemicals, purity: 99%)
(5) Barium sulfate (product of WAKO-Chemicals)
(6) Magnesium silicate (product of Kishida Chemical Co., Ltd., purity: 90%)

(E) Inorganic Filler

The following mentioned inorganic fillers were used.
Fused spherical silica A: Particle diameter of 50 μm or more is 0.1%, average particle diameter: 10 μm, refractive index: 1.43
Fused spherical silica B: Particle diameter of 5 μm or more is 0.5%, average particle diameter: 1.5 μm, refractive index: 1.43
Fused spherical silica C: Particle diameter of 50 μm or more is 20%, average particle diameter: 19 μm, refractive index: 1.43
Spherical cristobalite: Particle diameter of 50 μm or more is 0.1%, average particle diameter: 8 μm, refractive index: 1.52
Aluminosilicate: Particle diameter of 50 μm or more is 0.5%, average particle diameter: 15 μm, refractive index: 1.65
Wollastonite
Hollow silica: Particle diameter of 30 μm or more is 2.3%, average particle diameter: 12 μm Reaction Inhibitor The acetylene alcohol compound represented by the following formula was used as the reaction inhibitor.

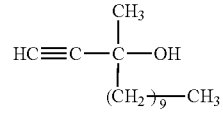

Mold Releasing Agent

The following was used as the mold release agent. RIKESTAR EW 440A (product of RIKEN VITAMIN CO., LTD.)

Adhesive Tackifier

The adhesive tackifier (H-1) represented by the following formula was used as an adhesive tackifier,

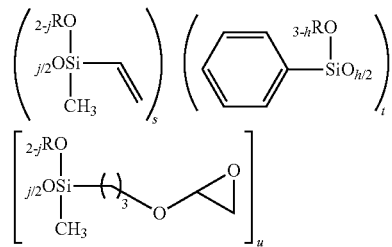

wherein h represents 2, j represents 1, s represents 3, t represents 6, and u represents 9.

Examples 1 to 15, Comparative Examples 1 to 5

The above-mentioned (A) to (E), reaction inhibitor, mold releasing agent and adhesive tackifier were blended with blending amounts (parts by mass) shown in Tables 2, 3 and 4, and kneaded by twin roller to obtain white thermosetting silicone resin compositions. Examples 1 to 15 are examples containing Components (A) to (E) of the present invention.

TABLE 2

| | | Examples No. | | | | | | | | | |
|---|---|---|---|---|---|---|---|---|---|---|---|
| | | 1 | 2 | 3 | 4 | 5 | 6 | 7 | 8 | 9 | 10 |
| (A) | A-1 | 93.8 | | | | | 93.8 | 93.8 | 93.8 | 93.8 | 93.8 |
| | A-2 | | 93.8 | | | | | | | | |
| | A-3 | | | 93.8 | | | | | | | |
| | A-4 | | | | 93.8 | 80 | | | | | |
| | A-5 | | | | | | | | | | |
| | A-6 | | | | | 13.8 | | | | | |
| (B) | B-1 | 3.9 | 8.1 | | 12.4 | 6.5 | 3.9 | 3.9 | 3.9 | 3.9 | 3.9 |
| | B-2 | | | | | | | | | | |
| | B-3 | 17.3 | 16 | 19.3 | 14.5 | 13.8 | 17.3 | 17.3 | 17.3 | 17.3 | 17.3 |

TABLE 2-continued

| | | Examples No. | | | | | | | | | |
|---|---|---|---|---|---|---|---|---|---|---|---|
| | | 1 | 2 | 3 | 4 | 5 | 6 | 7 | 8 | 9 | 10 |
| (C) | | 0.09 | 0.09 | 0.09 | 0.09 | 0.09 | 0.09 | 0.09 | 0.09 | 0.09 | 0.09 |
| (D) | Titanium oxide | 115.8 | 115.8 | 115.8 | 115.8 | 115.8 | | | | | |
| | Zinc oxide | | | | | | 115.8 | | | | |
| | Magnesium oxide | | | | | | | 115.8 | | | |
| | Barium carbonate | | | | | | | | 115.8 | | |
| | Barium sulfate | | | | | | | | | 115.8 | |
| | Magnesium silicate | | | | | | | | | | 115.8 |
| (E) | Fused spherical silica A | 458.3 | 400 | 410 | 300 | | 458.3 | 458.3 | 458.3 | 458.3 | 458.3 |
| | Fused spherical silica B | | 58.3 | | | 91.7 | | | | | |
| | Fused spherical silica C | | | | | | | | | | |
| | Cristobalite | | | | | 480 | | | | | |
| | Aluminosilicate | | | | 150 | | | | | | |
| | Wollastonite | | | | 150 | | | | | | |
| | Hollow silica | | | 20 | | | | | | | |
| Reaction controller | | 0.5 | 0.5 | 0.5 | 0.5 | 0.5 | 0.5 | 0.5 | 0.5 | 0.5 | 0.5 |
| Mold releasing agent | RIKESTAR EW | 0.7 | 0.7 | 0.7 | 0.7 | 0.7 | 0.7 | 0.7 | 0.7 | 0.7 | 0.7 |
| Adhesive tackifier | H-1 | 6.2 | 6.2 | 6.2 | | 6.2 | 6.2 | 6.2 | 6.2 | 6.2 | 6.2 |

TABLE 3

| | | Examples No. | | | | |
|---|---|---|---|---|---|---|
| | | 11 | 12 | 13 | 14 | 15 |
| (A) | A-1 | | | | | |
| | A-2 | | | | | |
| | A-3 | 93.8 | 93.8 | 93.8 | | |
| | A-4 | | | | 58.3 | 80.8 |
| | A-5 | | | | 35.5 | 13 |
| (B) | B-1 | 2.5 | 7.6 | 10.2 | 13.3 | 6.8 |
| | B-2 | | | | | |
| | B-3 | 12.5 | 14.6 | 19.5 | 17 | 14.9 |
| (C) | | 0.09 | 0.09 | 0.09 | 0.09 | 0.09 |
| (D) | Titanium oxide CR-95 | 115.8 | 115.8 | 200 | 115.8 | 115.8 |
| (E) | Fused spherical silica A | 320 | 250 | 300 | 150 | |
| | Fused spherical silica B | 91.7 | 91.7 | 90 | 91.7 | 100 |
| | Fused spherical silica C | | | | | |
| | cristobalite | | | | 300 | |
| | Aluminosilicate | | | | | 470 |
| | Wollastonite | | 100 | | 50 | 80 |
| | Hollow silica | 20 | 20 | | | |
| Reaction controller | EDMA | 0.5 | 0.5 | 0.5 | 0.5 | 0.5 |
| Mold releasing agent | RIKESTAR EW | 0.7 | 0.7 | 0.7 | 0.7 | 0.7 |
| Adhesive tackifier | H-1 | | | | 6.2 | 6.2 |

TABLE 4

| | | Comparative example No. | | | | |
|---|---|---|---|---|---|---|
| | | 1 | 2 | 3 | 4 | 5 |
| (A) | A-1 | | | | | |
| | A-2 | | | | | |
| | A-3 | | | 93.8 | 93.8 | 93.8 |
| | A-4 | | | | | |
| | A-5 | 93.8 | | | | 93.8 |
| (B) | B-1 | | | | | |
| | B-2 | 10.7 | | 15.9 | 7.6 | 53.7 |
| | B-3 | 23.5 | 6.9 | 34.8 | 14.6 | |
| (C) | | 0.09 | 0.09 | 0.09 | 0.09 | 0.09 |
| (D) | Titanium oxide CR-95 | 115.8 | 115.8 | 115.8 | 115.8 | 115.8 |
| (E) | Fused spherical silica A | 366.6 | 458.3 | 458.3 | | 458.3 |
| | Fused spherical silica B | | | 50 | 50 | 50 |

TABLE 4-continued

|  |  | Comparative example No. | | | | |
|---|---|---|---|---|---|---|
|  |  | 1 | 2 | 3 | 4 | 5 |
|  | Fused spherical silica C |  |  |  | 458.3 |  |
|  | cristobalite |  |  |  |  |  |
|  | Alumino-silicate |  |  |  |  |  |
|  | Wollastonite |  |  |  |  |  |
|  | Hollow silica | 91.7 |  |  |  |  |
| Reaction inhibitor | EDMA | 0.5 | 0.5 | 0.5 | 0.5 | 0.5 |
| Mold releasing agent | RIKE-STAR EW | 0.7 | 0.7 | 0.7 | 0.7 | 0.7 |
| Adhesive tackifier | H-1 | 6.2 | 6.2 | 6.2 | 6.2 | 6.2 |

Using the thermosetting silicone resin compositions obtained in Examples 1 to 15 and Comparative Examples 1 to 5, the following various characteristics were measured. The results are shown in Table 5. Molding was all performed by a transfer molding machine at a molding temperature of 175° C., a molding pressure of 6.9N/mm² and a molding time of 180 seconds.

Spiral Flow Value

Using a mold conforming to the EMMI standards, the spiral flow value was measured under the conditions of a molding temperature: 175° C., a molding pressure: 6.9N/mm², and a molding time: 120 seconds.

Melt Viscosity

Using a Koka flow tester and a nozzle of 1 mm in diameter, the viscosity was measured at a temperature of 150° C. under increased pressure of 25 kgf.

Bending Modulus of Elasticity

Using a mold conforming to JIS-K6911 standard, molding was performed under the conditions of a molding temperature: 175° C., a molding pressure: 6.9N/mm², and a molding time: 120 seconds, and then, postcure was performed at 150° C. for 2 hours. With regard to the thus obtained test pieces, bending modulus of elasticity was measured at 50° C. and 120° C. With regard to the ratio of the bending modulus of elasticity, it is a ratio of the measured values at 150° C. and 50° C.

Light Transmittance

A cured product having a square with each side of 50 mm and a thickness of 0.35 mm was prepared under the conditions of a molding temperature: 175° C., a molding pressure: 6.9 N/mm², and a molding time: 120 seconds, and optical reflectance at 450 nm was measured by using X-rite 8200 which is a product of S.D.C. K.K.

Measurement of Warpage

As illustrated in FIG. 1(A), using a copper lead frame on the whole surfaces of which had been silver-plated as a lead frame 5, and the matrix-type recessed reflector 1 was subjected to transfer molding (on the copper board which had been surface silver-plated, molding was carried out with a thickness of the sealing agent of 1 mm, a length of 38 mm, and a width of 16 mm) with the thermosetting silicone resin compositions prepared in Examples 1 to 15 and Comparative Examples 1 to 5 to produce matrix-type recessed reflector boards 10. Molding conditions are as follows.

molding temperature: 170° C., molding pressure: 70 Kg/cm², molding time: 3 minutes Postcure was further conducted at 170° C. for 2 hours.

Warpage of the reflector boards 10 was measured at the two direction of the diagonal lines of the above-mentioned postcured reflector boards 10 at the resin side, and shown with an average value.

TABLE 5

| Evaluation items | Example No. | | | | | | | |
|---|---|---|---|---|---|---|---|---|
| (Unit) | 1 | 2 | 3 | 4 | 5 | 6 | 7 | 8 |
| Spiral flow (inches) | 38 | 35 | 41 | 28 | 33 | 30 | 28 | 36 |
| Melt Viscosity (Pa·s) | 25 | 28 | 19 | 38 | 21 | 32 | 45 | 31 |
| Light transmittance (%) | 1.0 | 0.8 | 0.7 | 0.7 | 1.1 | 0.8 | 0.7 | 0.8 |
| Bending modulus of elasticity (Tg or lower) (N/mm²) | 5900 | 5590 | 5700 | 6200 | 5130 | 6200 | 6800 | 5300 |
| Bending modulus of elasticity (Tg or higher) (N/mm²) | 1550 | 1600 | 1380 | 1600 | 1200 | 1590 | 1700 | 1360 |
| Ratio of Bending modulus of elasticity (N/mm²) | 3.8 | 3.5 | 4.1 | 3.9 | 4.3 | 3.9 | 4.0 | 3.9 |
| Warpage of reflector (μm) | 500 | 480 | 450 | 450 | 380 | 400 | 410 | 420 |

| Evaluation items | Example No. | | | | | | |
|---|---|---|---|---|---|---|---|
| (Unit) | 9 | 10 | 11 | 12 | 13 | 14 | 15 |
| Spiral flow (inches) | 30 | 26 | 38 | 38 | 38 | 38 | 38 |
| Melt Viscosity (Pa·s) | 34 | 46 | 25 | 25 | 25 | 25 | 25 |
| Light transmittance (%) | 0.8 | 0.6 | 1.0 | 1.0 | 1.0 | 1.0 | 1.0 |

TABLE 5-continued

| | | | | | | | |
|---|---|---|---|---|---|---|---|
| Bending modulus of elasticity (Tg or lower) (N/mm$^2$) | 6200 | 6400 | 5900 | 5900 | 5900 | 5900 | 5900 |
| Bending modulus of elasticity (Tg or higher) (N/mm$^2$) | 1580 | 1580 | 1550 | 1550 | 1550 | 1550 | 1550 |
| Ratio of Bending modulus of elasticity (N/mm$^2$) | 3.9 | 4.1 | 3.8 | 3.8 | 3.8 | 3.8 | 3.8 |
| Warpage of reflector (μm) | 400 | 380 | 500 | 500 | 500 | 500 | 500 |

TABLE 6

| Evaluation items | Comparative example No. | | | | |
|---|---|---|---|---|---|
| (Units) | 1 | 2 | 3 | 4 | 5 |
| Spiral flow (inches) | 30 | Insufficient curing | Insufficient curing | 38 | 34 |
| Melt Viscosity (Pa·s) | 28 | Unable to measure | Unable to measure | 23 | 34 |
| Light transmittance (%) | 1.0 | Unable to measure | Unable to measure | 2.0 | 0.9 |
| Bending modulus of elasticity (Tg or lower) (N/mm$^2$) | 7800 | Unable to measure | Unable to measure | 5800 | 8100 |
| Bending modulus of elasticity (Tg or higher) (N/mm$^2$) | 5500 | Unable to measure | Unable to measure | 1600 | 6800 |
| Ratio of modulus of elasticity | 1.4 | Unable to measure | Unable to measure | 3.6 | 1.2 |
| Warpage of reflector (μm) | 1100 | Unable to mold | Unable to mold | 380 | 1350 |

Example 16

Next, as illustrated in FIG. 1, blue LED devices 3 were adhered and fixed on the respective lead frames 5 exposed at the recessed shape base of the matrix-type recessed reflector boards 10 prepared by using the thermosetting silicone resin compositions of Examples 1, 3 and 5 with a silicone die-bonding agent (Product name: LPS-8445S, product of Shin-Etsu Chemical Co., Ltd.), and another lead frame 5 was electrically connected with gold wires 4. Then, a silicone sealing agent (LPS-5547: product of Shin-Etsu Chemical Co., Ltd.) was each poured into the recessed portion at which LED devices 3 had been provided, and cured at 80° C. for 1 hour, and further at 150° C. for 1 hour to encapsulate. Also, by using the thermosetting silicone resin compositions of Comparative Examples 1 and 5, the same procedure was performed.

The matrix-type recessed reflector boards 10 completed the encapsulating step were subjected to dicing to prepare respective pieces, but the matrix-type recessed reflector boards using the thermosetting silicone resin compositions of Comparative Examples 1 and 5 had marked warpage, so that they cannot be cut. On the other hand, in the matrix-type recessed reflector boards prepared by using the thermosetting silicone resin compositions of Examples 1, 3 and 5, warpage was controlled so that dicing can be performed easily.

Using five LED apparatuses assembled by using discrete-type matrix reflector boards prepared by using the thermosetting silicone resin compositions of Examples 1, 3 and 5, they were allowed to stand in an atmosphere at 25° C. and 80% relative humidity for 48 hours, and passed through a reflow oven at 260° C. three times. Thereafter, adhesion failure between the encapsulating resin and a reflector surface or a device surface was observed. The LED apparatuses using the reflector molded by the thermosetting silicone resin composition of the present invention had caused no peeling failure.

It must be stated here that the present invention is not restricted to the embodiments shown by Examples. The embodiments shown by Examples are merely examples so that any embodiments composed of substantially the same technical concept as disclosed in the claims of the present invention and expressing a similar effect are included in the technical scope of the present invention.

What is claimed is:

1. A thermosetting silicone resin composition for a reflector of an LED, comprising:

(A) 45 to 90 parts by mass of an organopolysiloxane represented by the following average compositional formula (1), and having at least two alkenyl groups in one molecule,

$$R^1_a R^2_b R^3_c (OR^0)_d SiO_{(4-a-b-c-d)/2} \quad (1)$$

wherein $R^1$ each independently represents a substituted or unsubstituted monovalent hydrocarbon group having neither an alkenyl group nor an aryl group; $R^2$ represents an aryl group; $R^3$ represents an alkenyl group; $R^0$ represents a hydrogen atom, a methyl group or an ethyl group; "a" represents a number of 0.4 to 1.0; "b" represents a number of 0 to 0.5; "c" represents a number of 0.05 to 0.5; "d" represents a number of 0 to 0.5; and a+b+c+d=1.0 to 2.0;

(B) 10 to 55 parts by mass of a linear organohydrogenpolysiloxane represented by the following general formula (2) and a branched organohydrogenpolysiloxane represented by the following average compositional formula (3), which has at least two hydrogen atoms directly bonded to a silicon atom in one molecule, provided that the sum of Component (A) and Component (B) is 100 parts by mass,

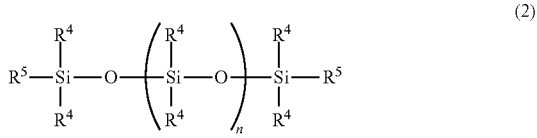
(2)

wherein $R^4$ each independently represents a substituted or unsubstituted monovalent hydrocarbon group having no alkenyl group; $R^5$ represents hydrogen; and a repeating unit "n" represents an integer of 1 to 10,

(3)

wherein $R^7$ each independently represents a substituted or unsubstituted monovalent hydrocarbon group containing neither an alkenyl group nor an aryl group; $R^8$ represents an aryl group; "e" represents a number of 0.6 to 1.5; "f" represents a number of 0 to 0.5; "g" represents a number of 0.4 to 1.0; and e+f+g=1.0 to 2.5;

(C) a catalytic amount of an addition reaction catalyst;
(D) 3 to 200 parts by mass of a white pigment selected from titanium oxide, zinc oxide, magnesium oxide, barium carbonate, magnesium silicate, zinc sulfate and barium sulfate; and
(E) 100 to 1000 parts by mass of an inorganic filler other than Component (D), Component (E) having an average particle diameter of 10 to 20 μm;
wherein an amount of Component (B) is 70% by mass or more based on a whole hydrogen atom-containing silicon compound having at least two hydrogen atoms directly bonded to a silicon atom in one molecule contained in the thermosetting silicone resin composition.

2. The thermosetting silicone resin composition for a reflector of an LED according to claim 1, wherein an average particle diameter of Component (D) is 0.05 to 5 μm.

3. The thermosetting silicone resin composition for a reflector of an LED according to claim 2, further comprising (F) a mold releasing agent.

4. The thermosetting silicone resin composition for a reflector of an LED according to claim 3, wherein the composition is a solid at room temperature.

5. The thermosetting silicone resin composition for a reflector of an LED according to claim 2, wherein the composition is a solid at room temperature.

6. The thermosetting silicone resin composition for a reflector of an LED according to claim 1, further comprising (F) a mold releasing agent.

7. The thermosetting silicone resin composition for a reflector of an LED according to claim 6, wherein the composition is a solid at room temperature.

8. The thermosetting silicone resin composition for a reflector of an LED according to claim 1, wherein the composition is a solid at room temperature.

9. A reflector for an LED molded by the thermosetting silicone resin composition for a reflector of an LED according to claim 1.

10. An optical semiconductor apparatus using the reflector for an LED according to claim 9.

11. The thermosetting silicone resin composition for a reflector of an LED according to claim 1, wherein Component (E) has a content of particles having a particle size exceeding 50 μm of 1% by mass or less.

* * * * *